United States Patent
Nielson et al.

(10) Patent No.: US 6,236,088 B1
(45) Date of Patent: May 22, 2001

(54) SEMICONDUCTOR DEVICE GATE STRUCTURE FOR THERMAL OVERLOAD PROTECTION

(75) Inventors: John Manning Savage Nielson, Norristown; Donald E. Burke, Mountaintip; Blake Andrew Gillett, Mountaintop, all of PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/338,891

(22) Filed: Jun. 23, 1999

Related U.S. Application Data

(63) Continuation of application No. 08/885,228, filed on Jun. 30, 1997, now abandoned.

(51) Int. Cl.$^7$ .................................................. H01L 23/62
(52) U.S. Cl. ........................ 257/355; 257/360; 257/364; 257/471
(58) Field of Search ...................... 857/355, 360, 857/363, 364, 409, 471, 916; 438/48, 54, 93, 284, 570

(56) References Cited

U.S. PATENT DOCUMENTS

| | | | |
|---|---|---|---|
| 4,963,970 | * 10/1990 | Throngnumchai et al. | 257/355 |
| 5,111,253 | * 5/1992 | Korman et al. | 257/471 |
| 5,561,312 | * 10/1996 | Nozoe et al. | 257/363 |
| 5,710,448 | * 1/1998 | Krautschneider et al. | 257/377 |
| 5,736,779 | * 4/1998 | Kobayashi | 257/360 |

FOREIGN PATENT DOCUMENTS 64-4073 * 1/1989 (JP) ..................... 257/360

OTHER PUBLICATIONS

Atsushi Ogura, Akira Furuya and Risho Koh, 50–nm–Thick Silicon–on–Insulator Fabrication by Advanced Epitaxial Lateral Overgrowth: Tunnel Epitaxy, J. Electrochemical Society, Apr. 1993, pp. 1125–1130, vol. 140, No. 4, Japan.

L. Jastrzebski, J.F. Corboy, J.T. McGinn and R. Pagliaro, Jr., Growth Process of Silicon Over SiO2 by CVD: Epitaxial Lateral Overgrowth Technique, J. Electrochemical Society, Jul. 1983, pp. 1571–1580, vol. 130, No. 7, Princeton, New Jersey.

R.P. Zingg, G.W. Neudeck, and B. Hoefflinger, Epitaxial Lateral Overgrowth of Silicon over Steps of Thick SiO2, J. Electrochemical Society, pp. 1274–1275, vol. 133, No. 6, West LAyfayette, Indiana(1986).

L. Jastrzebski, J.F. Corboy, and R. Pagliaro, Jr., Growth of Electronic Quality Silicon Over SiO2 by Epitaxial Lateral Overgrowth Technique, J. Electrochemical Society, Nov. 1982, pp. 2645–2648, vol. 129, No. 11, Princeton, New Jersey.

Z. John Shen and Stephen P. Robb, Monolithic Intergration of the Vertical IGBT and Intelligent Protection Circuits, IEEE, pp. 295–298, Phoenix, Arizona (1996).

* cited by examiner

*Primary Examiner*—Sara Crane
(74) *Attorney, Agent, or Firm*—Jaeckle Fleischmann & Mugel, LLP

(57) ABSTRACT

An arrangement for providing thermal overload protection for a gated electrode power semiconductor device comprises connecting the gate electrode of the device in a series circuit between the gate electrode terminal applying a bias voltage to the gate electrode and the source region adjoining the channel region controlled by the gate electrode. The series circuit includes an electrical resistor, preferably the gate electrode itself, and a temperature sensitive element blocking current flow through the gate electrode at safe operating temperatures, but allowing current flow, for de-biasing the gate electrode by IR drop through the resistor, when excessive device temperatures are sensed. The temperature sensitive element preferably comprises a reverse biased junction or Schottky barrier formed within the gate electrode.

5 Claims, 2 Drawing Sheets

SEMICONDUCTOR DEVICE GATE STRUCTURE FOR THERMAL OVERLOAD PROTECTION

This application is a continuation of Ser. No. 08/885,228, filed Jun. 30, 1997, now abandoned.

BACKGROUND OF THE INVENTION

This invention relates to semiconductor devices and, particularly, to gated semiconductor power devices and to means for protecting such devices against thermal overload conditions.

By "gated semiconductor power devices" is meant devices included within a relatively large class of devices making use of insulated gate structures in electrical power handling applications. Such class includes, but is not limited to, insulated gate bipolar transistors (IGBTs) metal-oxide-semiconductor field-effect transistors (MOSFETs) and MOS controlled thyristors (MCTs). Typically, such devices are "discrete" devices, i.e., one such device being contained within a single package, but one or more such devices can be included in power integrated circuit devices.

In general, the gate structures of such devices include, at a surface of a semiconductor substrate, a layer of metal, referred to as a gate electrode, overlying but dielectrically insulated from a channel region. The channel region is within the substrate and is disposed between source and drain regions also within the substrate. The gate electrode is electrically connected to a gate metal layer overlying the substrate but insulated therefrom for connecting the gate electrode to a terminal of the device. Similarly, the source region is electrically connected to a source region metal layer. Typically, the gate metal layer and the source region metal layer are disposed the same surface of the substrate and care is taken to avoid these metal layers from contacting one another.

In operation of such gated devices, charge carriers flow between the source and drain regions through the intervening channel region under control of a voltage signal applied to the gate electrode relative to the source region. The voltage difference between the gate electrode and the source region is a reason the gate and source metal layers are insulated from one another.

The present invention relates to the problem of thermal overloading of gated semiconductor power devices. During device operation, any number of conditions can occur in which the device is subjected to current overload while the device is in its conductive mode, i.e., the gate biased to provide a path for charge carriers through the channel region. For example, the electrical load under control of the device (e.g., a motor armature) can become shorted tending to cause the level of current flow through the device to increase sharply and the temperature of the device to rise very rapidly. Damage to the device can be avoided only if the gate bias is removed quickly enough to interrupt the current path through the channel region before the temperature of the device rises to excessive and disruptive levels.

This problem is well known and various schemes exist for protecting the semiconductor devices. Typically, such schemes make use of a temperature sensitive electrical component on the power device, e.g., a number of series connected diodes, and an electrical circuit responsive to sensed excessive temperatures for turning off the bias voltage applied to the gate electrode. Because integrated circuit technology is now well known, the electrical circuit can be included on and within the semiconductor substrate of otherwise "discrete" devices (see, for example, "Monolithic Integration of the Vertical IGBT and Intelligent Protection Circuits", Shen and Robb, O-7803-3106-0196, 1996 IEEE, pp. 295–298.

Problems with such known schemes, however, are that they add cost and complexity to the devices being protected and are generally slow acting.

The present invention provides an exceptionally simple and fast acting protection scheme.

SUMMARY OF THE INVENTION

A semiconductor device gate structure comprises a gate electrode overlying a channel region of the device but dielectrically separated therefrom. The channel region is interposed between a source region and a drain region and controls current flow therebetween under control of a bias voltage on the gate electrode relative to the source region. The gate electrode is directly connected to a gate terminal for applying a bias voltage to the gate electrode, and the gate electrode is electrically connected to a series circuit electrically interconnecting the gate terminal to the source region. Included in the series circuit is a temperature sensitive element and an electrical resistance element.

According to one aspect of the invention, the gate electrode is included in the series circuit and comprises the resistance element. In a preferred embodiment, the gate electrode is a layer of semiconductor material doped to form a temperature sensitive semiconductor junction at an end of the gate electrode proximate to the source region and to form a distributed resistor along the gate electrode where it overlies the channel region. The gate electrode can be formed of a monocrystalline or polycrystalline semiconductor material doped to include adjoining p and n type conductivity zones forming a p-n junction therebetween. One of the zones is far more heavily doped than the other zone, and such one zone is directly connected to a metal electrode for the source region. The other zone forms the distributed resistor and is ohmically connected to the gate electrode terminal.

Alternatively, the gate electrode can be of single conductivity type and of low conductivity where it contacts the source region metal electrode for forming a Schottky barrier device.

DESCRIPTION OF THE DRAWINGS

The drawings are schematic and not to scale.

DESCRIPTION OF PREFERRED EMBODIMENTS

Figure 1:
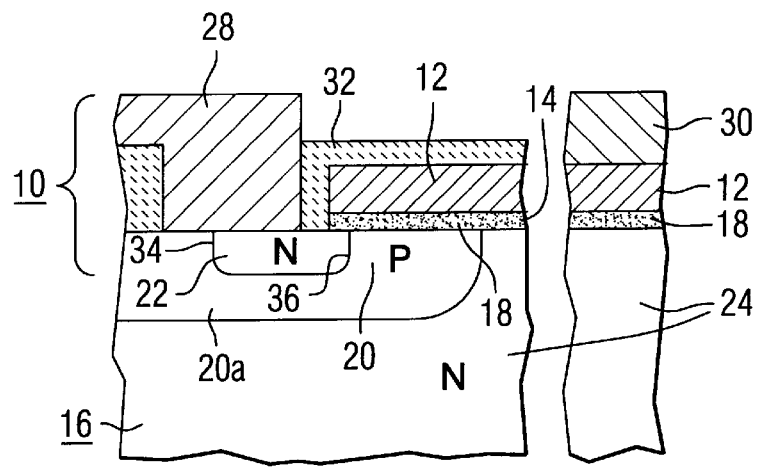
FIG. 1 shows an example of a known gate electrode structure.

As previously described, the invention has utility in a variety of different gated semiconductor power devices. Although structural details vary from device to device, common to all such devices is, as shown in FIG. 1, a gate electrode structure 10 including a gate electrode 12 of conductive material, e.g., doped polycrystalline silicon, spaced apart from a surface 14 of a semiconductor substrate 16, e.g., silicon, by a relatively thin layer 18 of insulating material, e.g., silicon dioxide (referred to as the "gate oxide layer"). The gate electrode 12 directly overlies a channel region 20 of one conductivity type, e.g., p type in this example, disposed between a source region 22 and a drain region 24, both of conductivity type opposite to that of the channel region 20, e.g., of n type in this embodiment. The gate electrode 12 extends partly over the source 22 and drain 24 regions Electrical connections are provided for applying voltages to various parts of the devices and different arrangements are used depending upon the particular device structure. In one common arrangement, as herein shown, the channel region 20 is part of a larger "body" region 20a in which is disposed the source region 22. A common electrical connection is made to the source 22 and body 20a regions by means of a layer 28 of metal referred to as the source metal.

The drain region 24 extends downwardly below the body region 20a and is electrically connected either directly or through one or more other regions to a metal electrode on a surface of the substrate 16 opposite to the surface 14 shown. The gate electrode 12 is connected to a layer 30 of metal referred to as the gate metal.

A typical discrete power device comprises a plurality of gate electrode structures 10 of the type shown disposed in side-by-side relation over the substrate surface 14. The drain region 24 extends beneath and is common to all the gate electrode structures.

The plural gate structures 10 are connected in parallel. The source metal 28 overlies much of the substrate surface and contacts all the source regions 22 (and associated body regions 20a). The gate metal 30 contacts all the gate electrodes 12.

A layer 32 of insulating material, e.g., silicon dioxide, covers one of the metal layers, in this case, all of the gate electrodes of the plural gate structures for electrically separating the source metal 28 and from the gate electrodes 12. The overlying source metal 28 projects downwardly through gaps or windows through the underlying insulating layer 32 for contacting exposed surfaces of the source 22 and body 20a regions. At the substrate surface 14, the insulating layer 32 contacts the substrate surface for electrically separating the gate electrode 12 from the source metal layer 28.

In operation of gated devices of the type illustrated in FIG. 1, the gate electrode 12 is biased relative to the source region 22 for controlling the electrical conductivity of a portion of the channel region 20 disposed between the source region 22 and the drain region 24. In the example shown, the p type channel region 20 forms respective p-n junctions 34 and 36 with the adjoining source 22 and drain 24 regions. Typically, in the absence of a suitable biasing voltage on the gate region, the channel region 20 blocks the flow of majority charge carriers, electrons in this device, between the source 22 and drain 24 regions even when the drain region 24 is biased positively relative to the source region 22. However, by applying a sufficiently large (threshold) positive bias relative to the source region 22 on the gate electrode 12, electrons are attracted into the channel region 20 at the substrate surface 14 for converting a surface zone of the channel region 20 to n-type conductivity for establishing a continuous n-type conductivity path for electrons from the source region 22 through the channel region 20 to the drain region 24.

Conversely, while current is flowing from the source region to the drain region, the current flow can be discontinued, i.e., turned off, by reducing the positive bias on the gate electrode to below the threshold voltage.

As mentioned, the power device illustrated in FIG. 1 comprises a plurality of side-by-side gate electrode structures 10 connected in parallel and overlying a common drain region 24. Preferably, the devices are quite symmetrical and the current density is uniform across the entire substrate surface. On occasion, however, asymmetries can occur and localized "hot spots" can develop where the current density is higher than normal. Such hot spots are particularly dangerous because the electrical conductivity of most semiconductor materials increases with temperature, and the hot spots tend to attract even higher current densities causing even higher temperatures and possible local damage of the device. An advantage of the present invention, as hereinafter described, is that local hot spots can be suppressed while allowing continued operation of the device.

Figure 2:
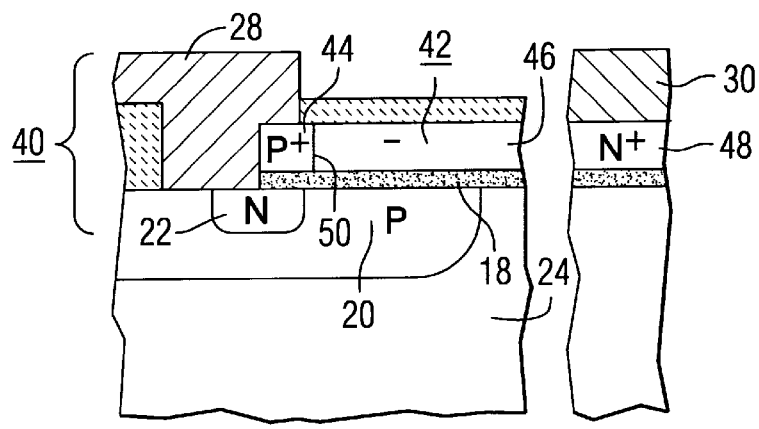
FIGS. 2 and 3 are similar to FIG. 1 but showing two different gate electrode structures in accordance with this invention.

FIG. 2 shows a gate electrode structure 40 in accordance with a preferred embodiment of the invention. Possible variations from the preferred version are described hereinafter.

For ease of understanding, the inventive gate electrode structure 40 shown in FIG. 2 is illustrated as being a modification of the known structure 10 shown in FIG. 1. The principal modification is that the gate electrode 42 in the inventive structure 40 is directly electrically connected to the source region 22 (substantially identical components in the two structures 10 and 40 being identified by the same reference numerals). Most simply, as shown, the gate electrode 42 is extended to more completely overlie the source region 22 and to connect directly with the source metal layer 28.

A further modification, in this preferred embodiment, is that the gate electrode 42 is of a semiconductor material doped to include two adjoining zones 44 and 46 of opposite type conductivity. In the illustrative structure 40, the channel region 20 is of p type conductivity, and turning on the device requires (as previously explained) a positive voltage bias on the gate electrode 42 relative to the source region 22. The polarity of this turn-on bias voltage determines the arrangement of the two zones 44 and 46 in the gate electrode 42.

Herein, the zone 44 which is directly connected to the source region metal layer 28 is doped p$^+$ (e.g., with boron at a concentration of $10^{19}$ per cm$^3$), while the zone 46 shown extending between the zone 44 and the gate electrode metal layer 30 is doped n$^-$ (e.g., with phosphorous at a concentration of between $10^{14}$–$10^{16}$ per cm$^3$).

The fact that the gate electrode is of a semiconductor material is itself not new. In the known structure 10 shown in FIG. 1, for example, the gate electrode is of heavily doped polycrystalline silicon ("polysilicon"). The doping level is not critical, except that it is high enough to provide an ohmic (non-rectifying), low resistance contact between the gate electrode 12 and the gate metal layer 30. Also, the gate electrode 12 is of the same (p or n) conductivity type along its entire length.

In the inventive structure 40, an ohmic contact between the gate electrode 42 and the gate metal layer 30 is also required and, to this end, a third zone 48 of heavy n$^+$ doping is provided at the end of the gate electrode 42 where it connects to the gate metal layer 30.

As illustrated, the gate electrode 42 forms an electrical series circuit between the gate electrode metal layer 30 and the source region metal layer 28. To applicants' knowledge, this alone is different from the prior art.

The series circuit between the gate electrode metal layer 30 and the source region metal layer 28 includes a distributed electrical resistance element, i.e., the zone 46 of low doping and low electrical conductivity (e.g., in the range of micromhos and a p-n junction 50 between the two zones 44 and 46 of opposite conductivity type.

The gate electrode 42 can be either polycrystalline or monocrystalline. A p-n junction is formed in either case. Normally, in the fabrication of p-n junction devices, monocrystalline semiconductor material is preferred for low leakage currents across the junction. As described hereinafter, the protection mechanism relies upon leakage currents across the junction 50 and, depending upon the particular device being made, a gate electrode 42 of doped polycrystalline material can be preferred to monocrystalline material.

Figure 3:
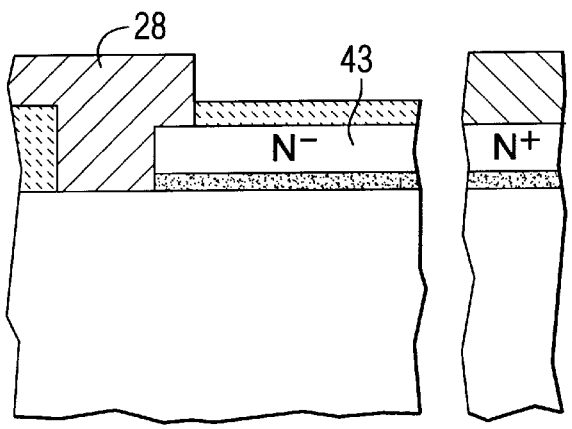
Figure 4:
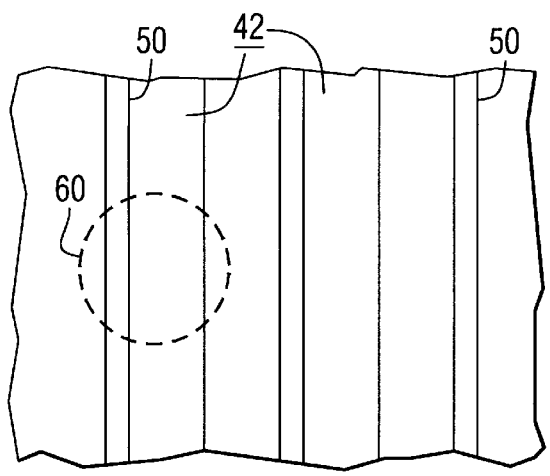
FIG. 4 is a plan view of a portion of a surface of a semiconductor substrate showing a pattern of side-by-side gate electrodes in accordance with this invention.

FIG. 3 shows a further embodiment of the invention where, instead of doping the gate electrode to include two opposite conductivity type zones to form a p-n junction 50, a gate electrode 43 is provided of single conductivity type (N, in this embodiment) and of uniformly low conductivity, e.g., in the aforementioned micromhos range. The connection between the low conductivity semiconductor material of the gate electrode 43 and the source region metal layer 28 provides a Schottky barrier device which, similarly as a p-n junction, has rectifying characteristics. Again, the level of leakage currents across a Schottky barrier device is a function of whether the semiconductor material is monocrystalline or polycrystalline, the latter resulting in higher leakage.

Both structure shown in FIGS. 2 and 3 are preferred embodiments, with the actual selection being a function of the particular devices being made and the fabrication technologies most conveniently available.

Whether a p-n junction element 50 is present in the FIG. 2 device or a Schottky barrier element is present as in the FIG. 3 device, both elements serve as a temperature sensitive device suitable for use in the inventive device. This is discussed hereinafter.

It is first noted that the fabrication of the inventive structure can be done using known semiconductor device technology. Gate electrodes of doped polysilicon are well known, and the only modifications required in the inventive structure involve the selective doping of the gate electrode 42 (by known techniques) to provide the junction 50, and the extension of the gate electrode 42 into ohmic electrical contact with the source region metal layer 28.

The use of a gate electrode 42 of monocrystalline silicon overlying a polycrystalline layer, i.e., the gate oxide layer 18, is somewhat unusual. However, techniques are known for providing monocrystalline layers overlying polycrystalline materials; see, for example, 1. 50-nm-Thick Silicon-on-Insulator Fabrication by Advanced Epitaxial Lateral Overgrowth Tunnel Epitaxy, A. Ogura, A. Furuya, R. Koh. JES, vol. 140, no. 4, 1993, p. 1125;
2. EPITAXIAL LATERAL OVERGROWTH OF SILICON OVER STEPS OF THICK SIO2, ZINGG RP, NEUDECK GW, HOEFFLINGER B, LIU ST. JES, vol. 133, no. 6, 1996, 1274;
3. GROWTH OF ELECTRONIC QUALITY SILICON OVERGROWTH TECHNIQUE, JASTRZEBSKI L, CORBOY JF, PAGLIARO, JR, R. JES, vol. 129, no. 11, 1982, p. 2645;
4. GROWTH PROCESS OF SILICON OVER SIO2 BY CVD: EPITAXIAL LATERAL OVERGROWTH TECHNIQUE, JASTRZESKI L, CORBOY JF, MCGINN JT, PAGLIARO, JR, R. JES, vol. 103, no. 7, 1983, p. 1571;

(the subject matter of which are incorporated herein by reference), and such known techniques, referred to as "extended lateral overgrowth" methods can be used.

Operation of devices incorporating the inventive structure in the current conducting mode (i.e., by current flow through the conduction channel zone induced between the source and drain regions) is substantially identical to the previously described operation of the known devices.

Thus, with a positive voltage on the gate electrode 42 relative to the source region 22 for inverting the conductivity type of a zone through the channel region 20, the positive voltage (applied to the gate electrode 42 via the gate metal 30) reverse biases the junction 50 between the two zones 44 and 46 of the gate electrode 42. Operation is the same whether the junction is a Schottky barrier or a p-n junction.

With the junction 50 reverse biased, majority charge carriers in the two zones (holes in the p-type zone 44 and electrons in the n-type zone 46) are blocked from being injected across the junction. The junction, however, is forward biased with respect to minority carriers in the two zones and these carriers are injected across the junction 50 and provide a leakage current through the series circuit between the source region metal layer 28 and the gate electrode metal layer 30.

However, owing to the quite low quantity of minority charge carriers available, at least at device normal operating temperatures, the leakage current is so low, in the order of microamperes, that very little IR voltage drop occurs along the gate electrode 42 which remains at a substantially uniform voltage bias relative to the source region 22. Substantially all the voltage difference between the gate electrode metal 30 and the source region metal 28 appears as a voltage drop across the junction 50.

Matters change, however, in conditions of excessive temperatures. As known, current flow across a junction (whether a Schottky barrier or a p-n junction) is an exponential function of temperature. Accordingly, even without change in biasing voltages, as the temperature of the device increases, the leakage current across the junction 50 likewise increases, but at an exponential rate. Knowing in advance the operating parameters of the gated power device and the maximum safe operating temperature, the distributed resistance along the gate electrode 42 is selected so that the amount of leakage current flowing at a preselected upper temperature is sufficient to de-bias at least a portion of the length of the gate electrode 42 to beneath the threshold voltage necessary to maintain the conductivity inversion of the channel.

For example, assume that the threshold gate voltage is 3 volts and that during a normal operation of a gated power device in its conductive mode, a full turn-on voltage of 10 volts is present on the gate electrode. Under device normal temperature operation, the voltage drop across the reverse biased junction 50 is 9.5 volts and, owing to the IR drop of the leakage current, the voltage along the length of the gate electrode varies between 9.5 volts at the junction 50 and 10 volts at the electrode metal 30. Thus, the entire length of the gate electrode 42 where it overlies the channel region 20 is well above the threshold voltage of 3.0 volts.

As the leakage current rises, however, the IR drop across the length of the gate electrode increases for decreasing the potential difference between the gate electrode and the source region 22. This reduces the conductivity of the conductive zone through the channel region 20 thus tending to reduce the otherwise temperature driven current therethrough. If the potential of the gate electrode 42 falls below 3.0 volts, the channel tends to revert to its original conductivity and to completely turn off the device.

If the gate electrode bias voltage remains unchanged, once the gated power device cools off, owing to the interruption or reduction of current flow therethrough, the de-biasing leakage current decreases to the point where the gate electrode bias voltage again turns on the device. If the thermal overload causing condition is temporary and ended by the time the device again fully turns on, normal operation can thereafter continue without external intervention.

A particular advantage of the invention is the avoidance of the problem normally caused by the aforementioned "hot spots". FIG. 3 is a plan view of a portion of the substrate of a gated power device containing a plurality of side-by-side gate electrode structures 40. Only the gate electrodes 40 and the junctions 50 in the gate electrodes are shown. It is assumed that a localized hot spot 60 is present somewhere along the length of one of the gate structures but not along its full length (or along some of the side-by-side, parallel gate structures but not under all). The hot spot 60 causes localized excessive heating of only a portion of the junction 50 adjacent to the hot spot, and increased leakage current occurs only across the excessively heated junction portion. Adjoining junction portions, depending upon their distance from the hot spot, are less excessively heated and inject proportionately less leakage current.

At the hot spot 60, the increased leakage current de-biases the gate electrode 42 associated with the hot spot, hence current through the hot spot is decreased. The hot spot is cooled and localized damage to the device is avoided.

Operation of the structure shown in FIG. 3 is substantially identical as for the FIG. 2 structure.

In the preferred embodiment described, the gate electrode 42 comprises a distributed resistor whereby localized de-biasing for localized current turn-off is possible.

Alternatively, a discrete resistor element, e.g., of the type used in integrated circuits, can be used for electrically interconnecting each of the plural (or all of the ) gate electrodes 42 to the gate electrode metal layer 30. For example, the discrete resistor can comprise a thin metal film. In such arrangement, increased leakage current through the discrete resistor serves to de-bias the entire gate electrode 42 interconnected through the discrete resistor.

FIGS. 5 through 8 are schematic circuit diagrams in accordance with current conventions illustrating the operation of the inventive gate electrode structures.

Figure 5:
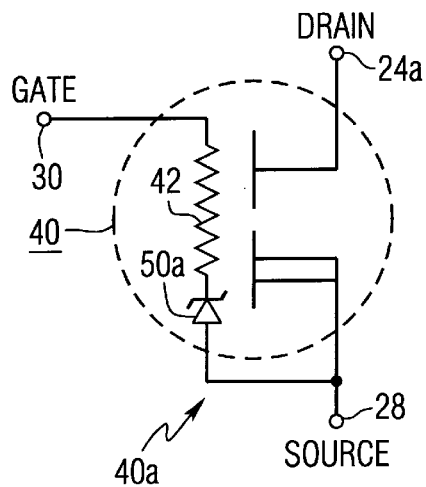
FIGS. 5–8 are schematic circuit diagrams illustrating various embodiments of the invention.

FIG. 5 corresponds to the preferred embodiment shown in FIGS. 2 and 3. The gate electrode structure 40 is shown as an MOS device 40a including a gate terminal 30 and source 28 and drain 24a terminals. The gate electrode 42 comprises a distributed resistor connected, via a temperature-sensitive diode 50a, to the source electrode 28. The end of the gate electrode furthest from the diode 50a is connected to the gate terminal 30.

During operation at normal temperatures and with a gate electrode voltage of a polarity for reverse biasing the diode 50a, the voltage at the anode of the diode 50a is substantially that of the voltage at the gate terminal 30, and the entire length of the gate electrode 42 is above a threshold voltage suitable for turning on the device 40a.

During operation at a preselected, excessive temperature, the leakage current through the diode 50a increases until a substantial voltage drop occurs along the gate electrode 42. When the voltage at the diode end of the gate electrode 42 falls below the device threshold voltage, turn-off of the device occurs.

Figure 6:
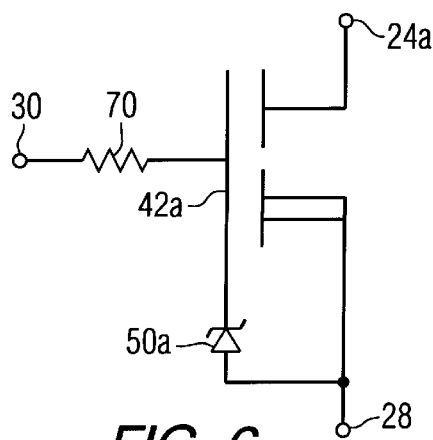

FIG. 6 shows the previously described arrangement where, instead of the use of a resistive gate electrode, a separate resistance element 70 is connected between the gate electrode 42a (of high conductivity in comparison with the gate electrode 42) and the gate terminal 30.

Operation of the FIG. 6 device is similar to the FIG. 5 device except that the voltage along the entire length of the gate electrode 42a is always constant.

In the preferred embodiment shown in FIGS. 2 and 3, the temperature sensitive element is a junction 50 formed within the gate electrode 42 itself. Alternatively, a temperature sensitive element can be disposed elsewhere on the gated power device being protected. Such element can comprise, for example, a plurality of diodes such as shown in the aforecited article to Shen and Robb and formed within the gated power device substrate in known fashion.

Figure 7:
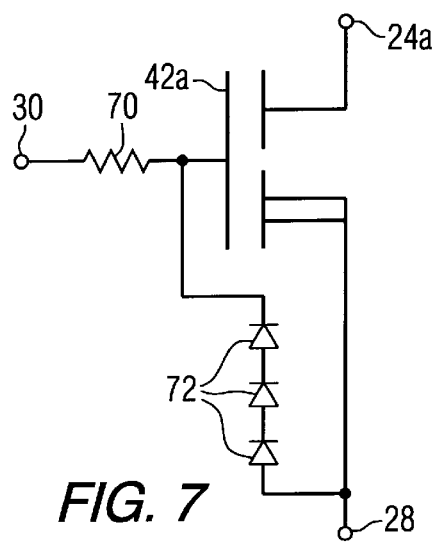

FIG. 7 shows a schematic circuit diagram of such arrangement where the substrate formed diodes 72 are connected in series with a discrete resistor 70 connected to the gate electrode terminal 30. The gate electrode 42a (of typically high conductivity) is connected at the intersection between the resistor 70 and the diode string 72.

Operation of the FIG. 7 device is similar to that of the FIG. 6 device except that the temperature being sensed is at the location of the diodes 72 rather than at the gate electrodes 42a.

Figure 8:
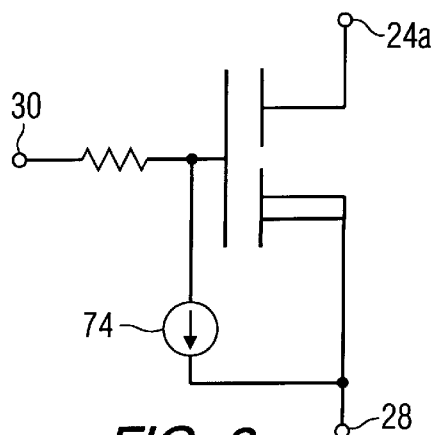

A generalized circuit is shown in FIG. 8 where the temperature sensitive device is shown as a temperature-sensitive current source for conducting current only in the direction shown.

What is claimed is:

1. A semiconductor device comprising a semiconductor substrate, a channel region within said substrate interposed between a source region of a first conductivity type and a drain region, a gate electrode of low conductivity and of said first conductivity type dielectrically spaced from said channel region, said gate electrode being ohmically connected to a terminal for applying a biasing voltage to said gate electrode relative to a source electrode contacting said source region, said gate electrode being electrically connected in a series circuit between said terminal and said source region, said gate electrode and said series circuit including a temperature sensitive semiconductor junction element for de-biasing at least a portion of the gate electrode voltage to a value below a selected threshold gate voltage in response to excessive temperatures of said channel region, said semiconductor junction element comprising said gate electrode directly connected to said source electrode.

2. The semiconductor device according to claim 1 wherein said channel region is disposed along a surface of said substrate, said gate electrode comprising a layer overlying said channel region and comprising a semiconductor material containing dopants for forming said semiconductor junction element.

3. The semiconductor device according to claim 1 wherein said gate electrode comprises a distributed electrical resistor.

4. A device according to claim 1 wherein said temperature sensitive semiconductor junction element comprises a Schottky barrier.

5. A semiconductor device as claimed in claim 1 wherein said semiconductor junction is formed to conduct a leakage current in the reverse direction, which leakage current increases with temperature and de-biases at least a portion of the gate electrode voltage to a value below a selected threshold gate voltage.

* * * * *